United States Patent
Freitag et al.

(10) Patent No.: US 7,505,235 B2
(45) Date of Patent: Mar. 17, 2009

(54) METHOD AND APPARATUS FOR PROVIDING MAGNETOSTRICTION CONTROL IN A FREELAYER OF A MAGNETIC MEMORY DEVICE

(75) Inventors: James Mac Freitag, San Jose, CA (US); Mustafa Michael Pinarbasi, Morgan Hill, CA (US)

(73) Assignee: Hitachi Global Storage Technologies Netherlands B.V. (NL)

( * ) Notice: Subject to any disclaimer, the term of this patent is extended or adjusted under 35 U.S.C. 154(b) by 0 days.

(21) Appl. No.: 11/751,361

(22) Filed: May 21, 2007

(65) Prior Publication Data

US 2007/0217088 A1    Sep. 20, 2007

Related U.S. Application Data

(63) Continuation-in-part of application No. 10/712,168, filed on Nov. 12, 2003, now Pat. No. 7,230,802.

(51) Int. Cl.
*G11B 5/127* (2006.01)
(52) U.S. Cl. .................................. 360/324.12
(58) Field of Classification Search ............ 360/324.11, 360/324.12
See application file for complete search history.

(56) References Cited

U.S. PATENT DOCUMENTS

| | | | | |
|---|---|---|---|---|
| 6,175,477 B1 * | 1/2001 | Lin et al. ................. | 360/324.12 |
| 6,473,278 B1 * | 10/2002 | Gill ........................ | 360/324.12 |
| 6,538,859 B1 * | 3/2003 | Gill ........................ | 360/324.12 |
| 6,757,962 B2 * | 7/2004 | Hasegawa et al. ......... | 29/603.14 |
| 6,862,159 B2 * | 3/2005 | Hasegawa ............... | 360/324.11 |
| 6,893,740 B2 * | 5/2005 | Saito ........................... | 428/668 |
| 6,921,587 B2 * | 7/2005 | Hasegawa et al. ........... | 428/686 |
| 6,979,500 B2 * | 12/2005 | Hasegawa et al. ......... | 428/811.2 |
| 6,995,961 B2 * | 2/2006 | Hasegawa et al. ...... | 360/324.12 |
| 7,054,115 B2 * | 5/2006 | Hasegawa et al. ...... | 360/324.12 |
| 7,092,218 B2 * | 8/2006 | Hasegawa et al. ........... | 360/321 |
| 7,154,716 B2 * | 12/2006 | Gill ......................... | 360/324.2 |
| 7,161,771 B2 * | 1/2007 | Lin et al. ..................... | 360/314 |
| 2002/0069511 A1 * | 6/2002 | Hasegawa et al. ......... | 29/603.14 |
| 2003/0143431 A1 * | 7/2003 | Hasegawa .................... | 428/692 |
| 2003/0203238 A1 * | 10/2003 | Saito ....................... | 428/694 R |
| 2004/0004792 A1 * | 1/2004 | Hasegawa et al. ...... | 360/324.12 |
| 2004/0072020 A1 * | 4/2004 | Hasegawa et al. ........... | 428/692 |
| 2005/0073777 A1 * | 4/2005 | Hasegawa et al. ........... | 360/321 |
| 2005/0157435 A1 * | 7/2005 | Ikarashi et al. ......... | 360/324.11 |
| 2005/0243479 A1 * | 11/2005 | Gill ........................ | 360/324.12 |
| 2006/0240289 A1 * | 10/2006 | Mizuno et al. .............. | 428/812 |
| 2008/0145523 A1 * | 6/2008 | Ikarashi et al. .............. | 427/130 |

* cited by examiner

*Primary Examiner*—Allen T Cao
(74) *Attorney, Agent, or Firm*—Merchant & Gould

(57) ABSTRACT

A method and apparatus for providing magnetostriction control in a synthetic free layer of a magnetic memory device is disclosed. A first free layer of CoFe alloy has a first thickness. A second free layer of NiFe alloy has a second thickness. At least one of the CoFe alloy and NiFe alloy includes at least one of B, P, Si, Nb, Zr, Hf, Ta and Ti. The relative thicknesses of the first and second free layer are modified to obtain a desired magnetostriction without a change in the magenetoristance ratio, ΔR/R. The synthetic free layer may also be configured to have a net magnetic moment. A sensor may be a current-in-plane or a current-perpendicular-to-the-plane sensor. The sensor also may be configured to be a GMR sensor or a TMR sensor.

21 Claims, 12 Drawing Sheets

METHOD AND APPARATUS FOR PROVIDING MAGNETOSTRICTION CONTROL IN A FREELAYER OF A MAGNETIC MEMORY DEVICE

RELATED APPLICATION

This application is a continuation-in-part of U.S. application Ser. No. 10/712,168, filed Nov. 12, 2003 now U.S. Pat. No. 7,230,802, which is hereby incorporated by reference.

BACKGROUND

1. Fields of the Embodiments of the Invention

This invention relates in general to sensors for magnetic storage devices, and more particularly to a method and apparatus for providing magnetostriction control in a free layer of a magnetic memory device.

2. Description of Related Art

Magnetic recording is a key segment of the information-processing industry. While the basic principles are one hundred years old for early tape devices, and over forty years old for magnetic hard disk drives, an influx of technical innovations continues to extend the storage capacity and performance of magnetic recording products. For hard disk drives, the areal density or density of written data bits on the magnetic medium has increased by a factor of more than two million since the first disk drive was used for data storage. Areal density continues to grow due to improvements in magnet recording heads, media, drive electronics, and mechanics.

Magnetic recording heads have been considered the most significant factor in areal-density growth. The ability of the magnetic recording heads to both write and subsequently read magnetically recorded data from the medium at data densities well into the gigabits per square inch (Gbits/in$^2$) range gives hard disk drives the power to remain the dominant storage device for many years to come.

Important components of computing platforms are mass storage devices including magnetic disk and magnetic tape drives, where magnetic tape drives are popular, for example, in data backup applications. Write and read heads are employed for writing magnetic data to and reading magnetic data from the recording medium. The read and write heads are connected to processing circuitry that operates according to a computer program to implement the writing and reading functions.

A magnetoresistive (MR) sensor changes resistance in the presence of a magnetic field. Recorded data can be read from a recorded magnetic medium, such as a magnetic disk, because the magnetic field from the recorded magnetic medium causes a change in the direction of magnetization in the read element, which causes a corresponding change in the sensor resistance.

A magnetoresistive (MR) sensor detects magnetic field signals through the resistance changes of a sensing element as a function of the strength and direction of magnetic flux being sensed by the sensing element. Conventional MR sensors, such as those used as MR read heads for reading data in magnetic recording disk and tape drives, operate on the basis of the anisotropic magnetoresistive (AMR) effect of the bulk magnetic material, which is typically permalloy. A component of the read element resistance varies as the square of the cosine of the angle between the magnetization direction in the read element and the direction of sense current through the read element. Recorded data can be read from a magnetic medium, such as the magnetic disk in a magnetic disk drive, because the external magnetic field from the recorded magnetic medium (the signal field) causes a change in the direction of magnetization in the read element, which in turn causes a change in resistance of the read element. This change in resistance may be used to detect magnetic transitions recorded on the recording media.

Increased storage capacity have been made possible using giant magnetoresistance (GMR) sensors and tunneling magnetoresistive (TMR) sensors that are based on the giant magnetoresistance (GMR) effect, which is also known as the spin-valve effect. In a spin valve sensor, the GMR effect varies as the cosine of the angle between the magnetization of the pinned layer and the magnetization of the free layer. Recorded data can be read from a magnetic medium because the external magnetic field from the recorded magnetic medium, or signal field, causes a change in the direction of magnetization of the free layer, which in turn causes a change in the resistance of the spin valve sensor and a corresponding change in the sensed current or voltage.

Magnetic sensors utilizing the GMR effect are found in mass storage devices such as, for example, magnetic disk and tape drives and are frequently referred to as spin-valve sensors. In an AFM pinned spin valve, the pinned layer is magnetically pinned or oriented by an adjacent pinning layer. In a self-pinned spin valve, the magnetic moment of the pinned layer is pinned in the fabrication process, i.e., the magnetic moment is set by the specific thickness and composition of the film.

Recently, magnetic tunnel junction sensor devices have been proposed for a variety of applications, including read heads for magnetic disks as well as magnetoresistive random access memory. A magnetic tunnel junction (MTJ) is a type or magnetoresistive device made of at least two magnetic film layers separated by an insulating barrier. The insulating barrier is thin enough to allow electrons to quantum mechanically tunnel through the barrier. Resistance of an MTJ is directly related to the tunneling probability that depends on the relative orientation of the magnetization vectors of the magnetic layers. Because the orientation of the magnetization vector depends on the applied field, the resistance of a MTJ device varies in the presence of a magnetic field.

Spin valve sensors and MTJ devices include at least three layers of thin material that combine into a single structure. A free layer acts as the sensing layer. The free layer is passed over the surface of the data bits to be read. It is free to rotate in response to the magnetic patterns on the disk. A separation layer is provide adjacent the free layer. In a GMR sensor, the separation layer is a conductor, such as copper. In MTJ devices, the separation layer is an insulation layer, such as $Al_2O_3$. The pinned layer is a layer of material that is held in a fixed magnetic orientation as described above.

Free layer magnetostriction is one of the key parameters that need to be controlled for good sensor performance. A free layer is often formed using a bilayer structure, such as CoFe and NiFe. Currently the magnetostriction control for bilayer structure for the free layer is accomplished by changing the composition of a layer, e.g., the NiFe or CoFe layer. However, changing the composition of a layer is very time consuming and costly, but is often required as sensor designs change.

It can be seen that there is a need for a method and apparatus for providing magnetostriction control in a free layer of a magnetic memory device.

SUMMARY OF THE EMBODIMENTS OF THE PRESENT INVENTION

To overcome the limitations in the prior art described above, and to overcome other limitations that will become apparent upon reading and understanding the present specification, embodiments of the present invention include a method and apparatus for providing magnetostriction control in a free layer of a magnetic memory device.

Embodiments of the present invention include a first free layer of CoFe alloy has a first thickness. A second free layer of NiFe alloy has a second thickness. At least one of the CoFe alloy and NiFe alloy includes at least one of B, P, Si, Nb, Zr, Hf, Ta and Ti. The relative thicknesses of the first and second free layer are modified to obtain a desired magnetostriction without a change in the magenetoristance ratio, ΔR/R. A sensor may be a current-in-plane or a current-perpendicular-to-the-plane sensor. The sensor also may be configured to be a GMR sensor or a TMR sensor.

A method in accordance with one embodiment of the present invention includes forming a pinned layer, forming a separation layer over the pinned layer, forming a first free layer having a first thickness, the first free layer comprising a CoFe alloy and forming a second free layer having a second thickness, the second free layer comprising a NiFe alloy, wherein at least one of the CoFe alloy and NiFe alloy includes at least one of B, P, Si, Nb, Zr, Hf, Ta and Ti, and wherein the ratio of the first thickness and second thickness being selected to provide a desired magnetostriction.

In another embodiment of the present invention, a magnetic sensor is provided. The magnetic sensor includes a pinned layer, a separation layer formed over the pinned layer, a first free layer having a first thickness, the first free layer comprising a CoFe alloy and a second free layer having a second thickness, the second free layer comprising a NiFe alloy, wherein at least one of the CoFe alloy and NiFe alloy includes at least one of B, P, Si, Nb, Zr, Hf, Ta and Ti, and wherein the ratio of the first thickness and second thickness being selected to provide a desired magnetostriction.

In another embodiment of the present invention, a magnetic storage system is provided. The magnetic storage system includes a movable magnetic recording medium, a magnetic sensor for detecting magnetic signals on the moveable recording medium, including a pinned layer, a separation layer formed over the pinned layer, a first free layer having a first thickness, the first free layer comprising a CoFe alloy and a second free layer having a second thickness, the second free layer comprising a NiFe alloy. The magnetic storage system further includes a magnetoresistance detector, coupled to the magnetic sensor, for detecting an electrical resistance through the magnetic sensor based on magnetic orientations of the first and the second free layers and an actuator, coupled to the magnetic sensor, for moving the sensor relative to the medium. At least one of the CoFe alloy and NiFe alloy includes at least one of B, P, Si, Nb, Zr, Hf, Ta and Ti, and wherein the ratio of the first thickness and second thickness being selected to provide a desired magnetostriction.

These and various other advantages and features of novelty which characterize the embodiments of the present invention are pointed out with particularity in the claims annexed hereto and form a part hereof. However, for a better understanding of the embodiments of the present invention, their advantages, and the objects obtained by their use, reference should be made to the drawings which form a further part hereof, and to accompanying descriptive matter, in which there are illustrated and described specific embodiments of the present invention.

BRIEF DESCRIPTION OF THE DRAWINGS

Referring now to the drawings in which like reference numbers represent corresponding parts throughout.

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the embodiments of the present invention.

Embodiments of the present invention provide a method and apparatus for providing magnetostriction control in a free layer of a magnetic memory device. A first free layer of CoFe alloy has a first thickness. A second free layer of NiFe alloy has a second thickness. At least one of the CoFe alloy and NiFe alloy includes at least one of B, P, Si, Nb, Zr, Hf, Ta and Ti. The relative thicknesses of the first and second free layer are modified to obtain a desired magnetostriction without a change in the magenetoristance ratio, ΔR/R. A sensor may be a current-in-plane or a current-perpendicular-to-the-plane sensor. The sensor also may be configured to be a GMR sensor or a TMR sensor.

Figure 1:
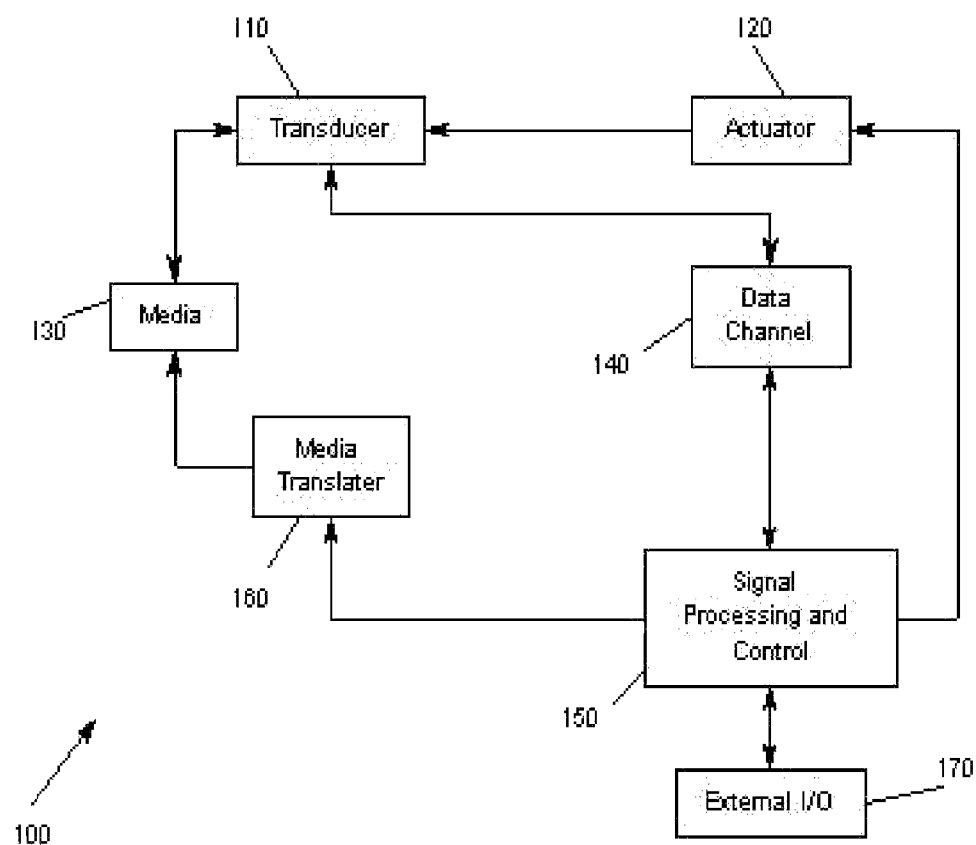
FIG. 1 illustrates a storage system according to an embodiment of the present invention.

FIG. 1 illustrates an exemplary storage system 100 according to an embodiment of the present invention. A transducer 110 is under control of an actuator 120, whereby the actuator 120 controls the position of the transducer 110. The transducer 110 writes and reads data on magnetic media 130. The read/write signals are passed to a data channel 140. A signal processor 150 controls the actuator 120 and processes the signals of the data channel 140 for data exchange with external Input/Output (I/O) 170. I/O 170 may provide, for example, data and control conduits for a desktop computing application, which utilizes storage system 100. In addition, a media translator 160 is controlled by the signal processor 150 to cause the magnetic media 130 to move relative to the transducer 110. Embodiments of the present invention are not meant to be limited to a particular type of storage system 100 or to the type of media 130 used in the storage system 100.

Figure 2:
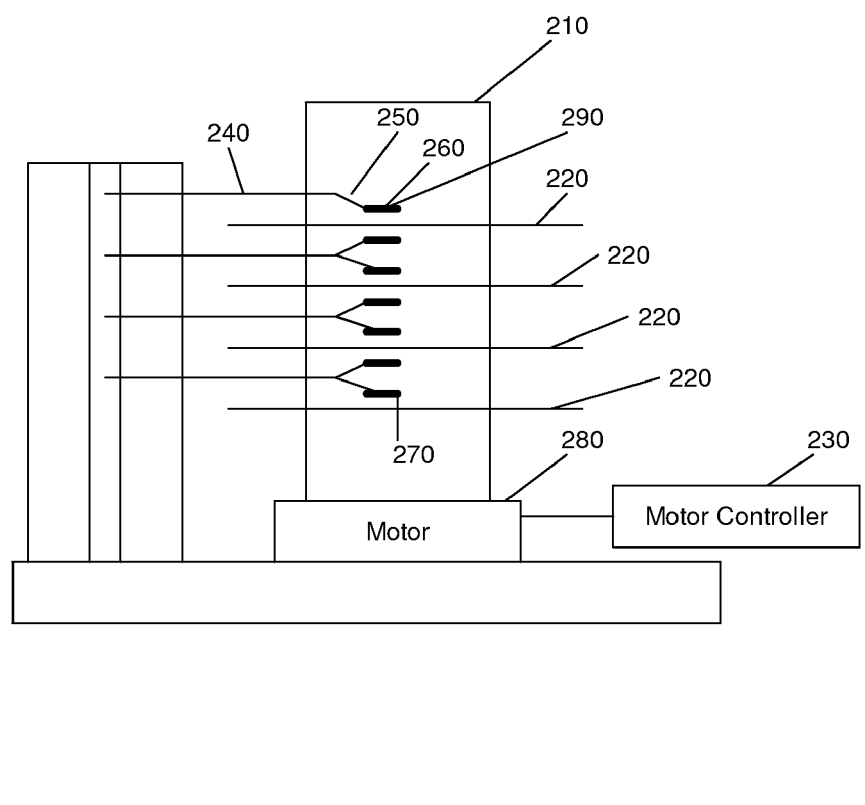
FIG. 2 illustrates one storage system according to an embodiment of the present invention.

FIG. 2 illustrates one particular embodiment of a multiple magnetic disk storage system 200 according to an embodiment of the present invention. Those skilled in the art will recognize that embodiments of the present invention are not meant to be limited to the storage system described here. Rather, embodiments of the present invention may be utilized in disk drives, tape drives, or other storage or magnetic sensing systems. In FIG. 2, a hard disk drive storage system 200 is shown. The system 200 includes a spindle 210 that supports and rotates multiple magnetic disks 220. The spindle 210 is rotated by motor 280 that is controlled by motor controller 230. A combined read and write magnetic head 270 is mounted on slider 260 that is supported by suspension 250 and actuator arm 240. Processing circuitry exchanges signals that represent information with read/write magnetic head 270, provides motor drive signals for rotating the magnetic disks 220, and provides control signals for moving the slider 260 to various tracks. Although a multiple magnetic disk storage system is illustrated, a single magnetic disk storage system is equally viable in accordance with the embodiments of the present invention.

The suspension 250 and actuator arm 240 position the slider 260 so that read/write magnetic head 270 is in a transducing relationship with a surface of magnetic disk 220. When the magnetic disk 220 is rotated by motor 280, the slider 240 is supported on a thin cushion of air (air bearing) between the surface of disk 220 and the ABS 290. Read/write magnetic head 270 may then be employed for writing information to multiple circular tracks on the surface of magnetic disk 220, as well as for reading information therefrom.

Figure 3:
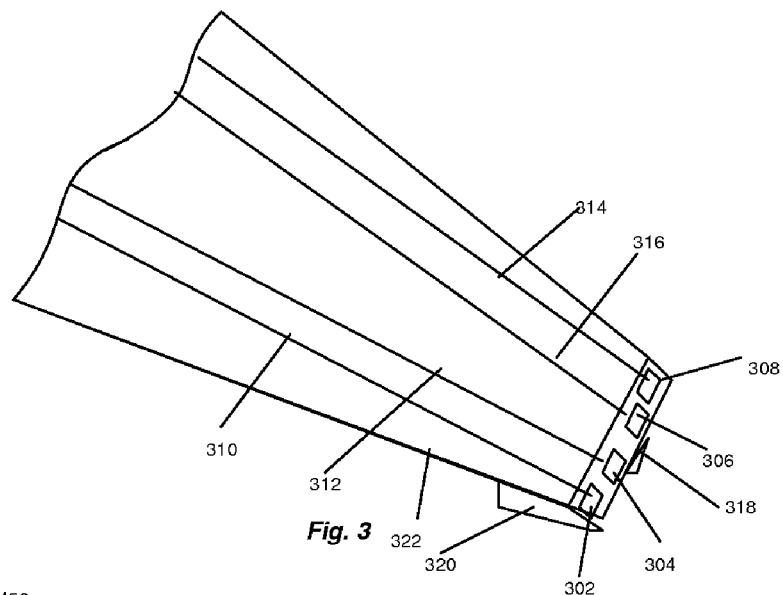
FIG. 3 illustrates a slider mounted on a suspension according to an embodiment of the present invention.

FIG. 3 illustrates a slider 320 mounted on a suspension 322. First and second solder connections 302 and 308 connect leads from the sensor 318 to leads 310 and 314, respectively, on suspension 322 and third and fourth solder connections 304 and 306 connect to the write coil (not shown) to leads 312 and 316, respectively, on suspension 322.

Figure 4:
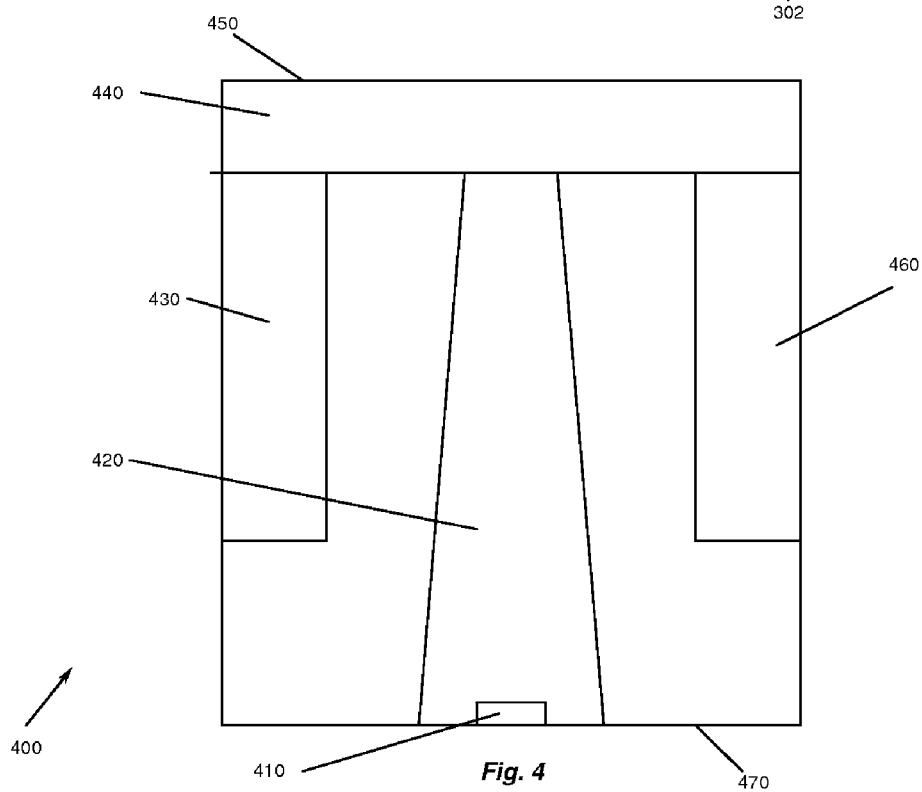
FIG. 4 illustrates an ABS view of the slider and the magnetic head according to an embodiment of the present invention.

FIG. 4 is an ABS view of slider 400 and magnetic head 410. The slider has a center rail 420 that supports the magnetic head 410, and side rails 430 and 460. The support rails 420, 430 and 460 extend from a cross rail 440. With respect to rotation of a magnetic disk, the cross rail 440 is at a leading edge 450 of slider 400 and the magnetic head 410 is at a trailing edge 470 of slider 400.

The above description of a typical magnetic recording disk drive system, shown in the accompanying FIGS. 1-4, is for presentation purposes only. Storage systems may contain a large number of recording media and actuators, and each actuator may support a number of sliders. In addition, instead of an air-bearing slider, the head carrier may be one that maintains the head in contact or near contact with the disk, such as in liquid bearing and other contact and near-contact recording disk drives.

Figure 5:
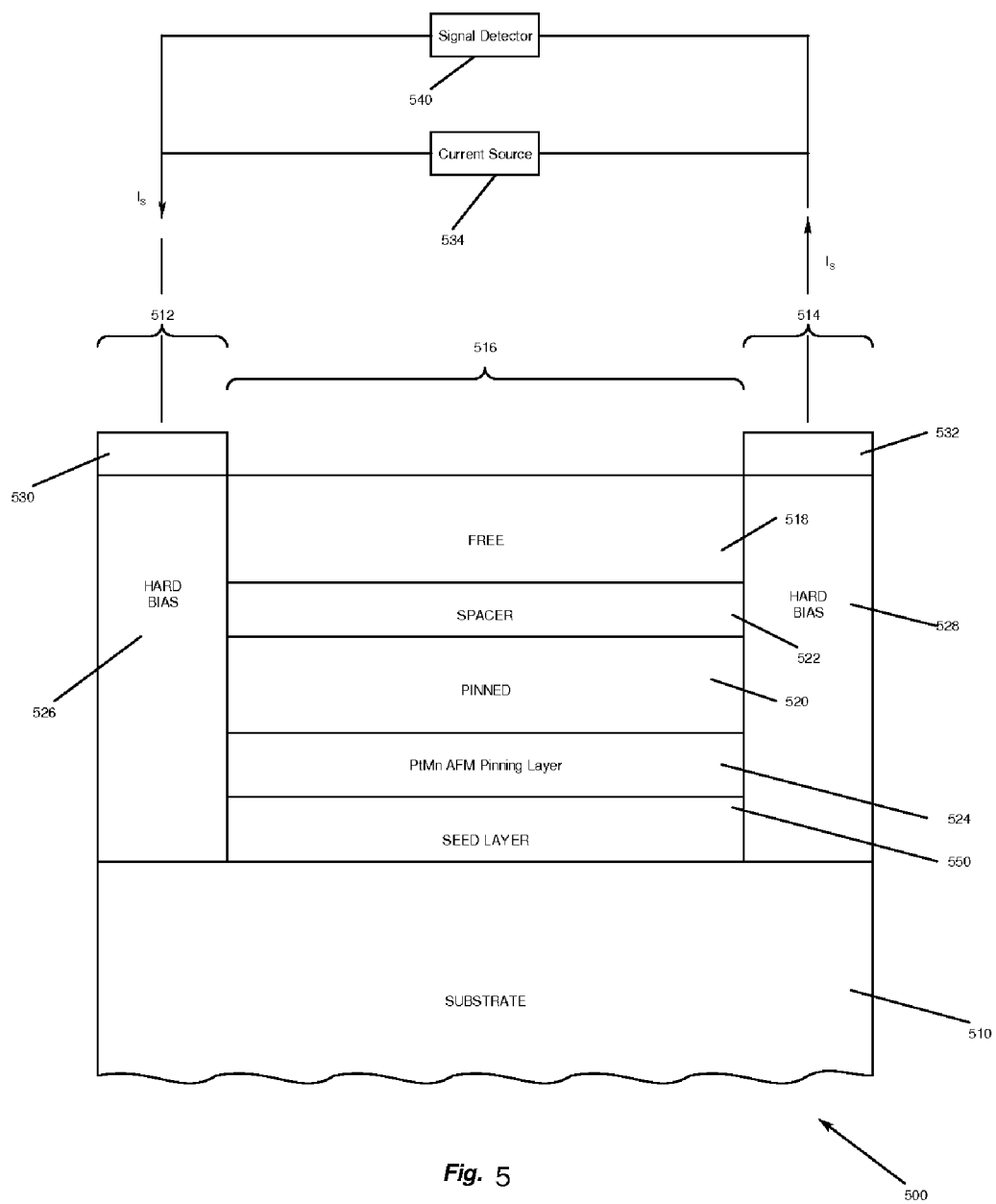
FIG. 5 illustrates an air bearing surface view of a current-in-plane (CIP) GMR sensor according to an embodiment of the present invention.

FIG. 5 illustrates an air bearing surface view of a current-in-plane (CIP) GMR sensor 500 according to an embodiment of the present invention. GMR heads are very attractive for use as high density recording magneto resistive (MR) heads because of their high readback output voltages, linear response, and symmetrical read sensitivity profiles.

In FIG. 5, an air bearing surface view of a GMR sensor 500 including end regions 512 and 514 separated by a central region 516 is shown. A free layer (free ferromagnetic layer) 518 is separated from a pinned layer (AP-pinned ferromagnetic layer) 520 by a non-magnetic, electrically conducting separation layer 522 (typically, primarily copper). The free layer 518 according to an embodiment of the present invention will be discussed in more detail below. The magnetization of the pinned layer 520 may be fixed through exchange coupling with an antiferromagnetic (AFM) layer 524. The magnetization of the free layer 518, however, is free to rotate in the presence of an external field. Free layer 518, separation layer 522, pinned layer 520 and the AFM layer 524 are all formed in the central region 516.

Hard bias layers 526 and 528 formed in the end regions 512 and 514, respectively, provide longitudinal bias for the free layer 518. A seedlayer structure 550 is provided on a substrate 510 to promote the texture and enhance the grain growth of each of the layers consequently grown adjacent to the seedlayer structure 550, such as the hard bias layer. Leads 530 and 532 formed over hard bias layers 526 and 528, respectively, provide electrical connections for the flow of the sensing current $I_s$, from a current source 534 to the GMR sensor 500. The sensor current in a current-in-plane sensor flows from one end of the free layer to the other end of the free layer in the plane of the free layer.

A signal detector 540, which is electrically connected to the leads 530 and 532, senses the change in resistance of the GMR sensor 500 due to changes induced by the external magnetic field (e.g., the field generated when a field transition on a disk is moved past the GMR sensor 500). A cap (not shown) is optionally provided on the free layer 518. Other constructions of the GMR sensor 500 are possible, and one skilled in the art could readily adapt an embodiment of the present invention for use with such alternative constructions.

Within the sandwich structure of the GMR head sensor, i.e., "sensing free layer", "conducting space layer", and "pinned layer", the magnetization of the free layer is free to respond to external magnetic field from the media. The magnetization of the pinned layer is pinned at about 90° to the magnetization of the free layer. As the conduction electrons are scattered between the free and pinned layers through the separation layer, the electrical resistance of the head changes in response to the angle of the directions of magnetization between the free and pinned layers.

Figure 6:
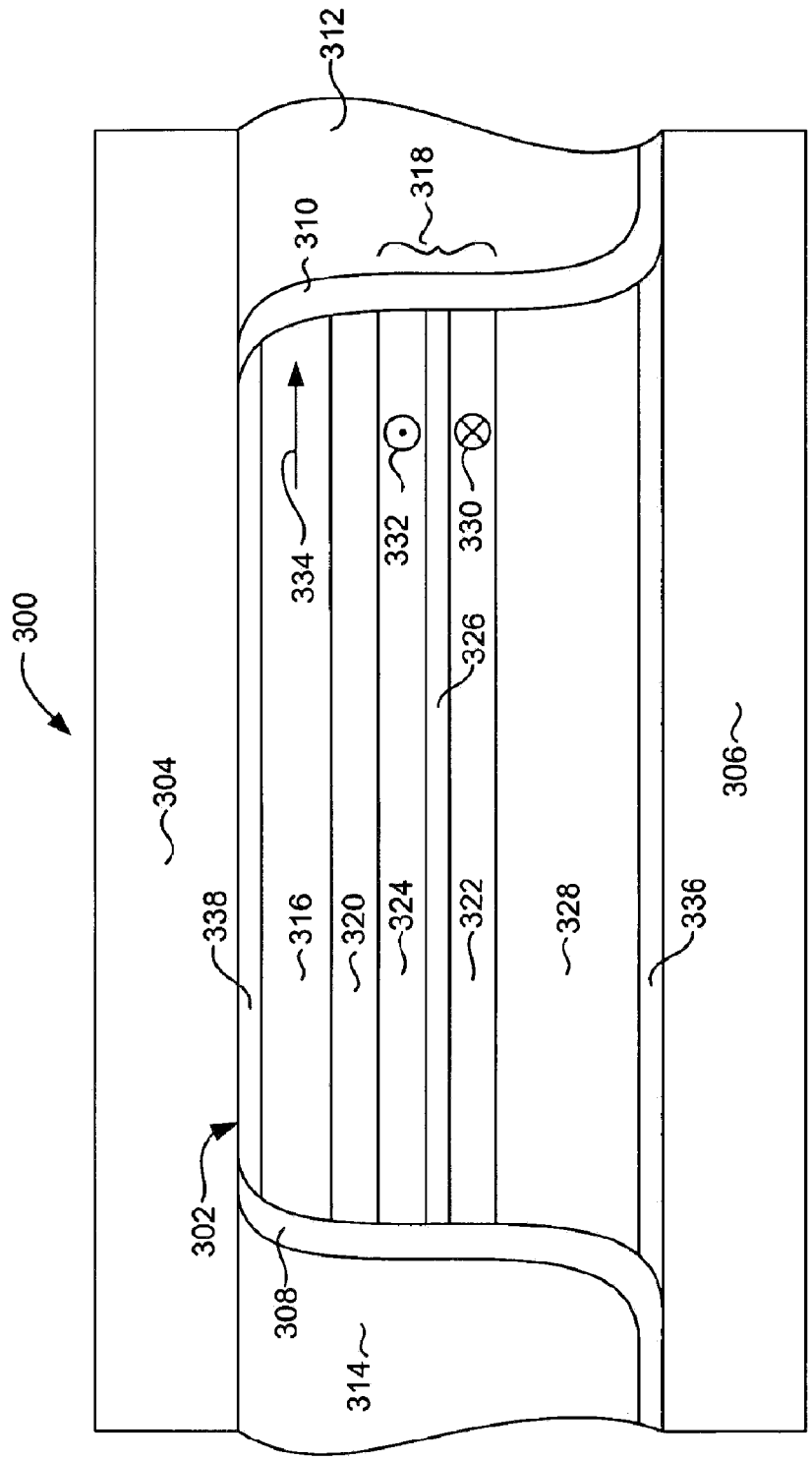
FIG. 6 illustrates an air bearing surface view of a current-perpendicular-to-the-plane (CPP) GMR sensor according to another embodiment of the present invention.

FIG. 6 illustrates an air bearing surface view of a current-perpendicular-to-the-plane (CPP) GMR sensor 600 according to another embodiment of the present invention. In FIG. 6, the magnetoresistive sensor 600 includes a magnetoresistive sensor element or sensor stack 602, sandwiched between first and second leads 604, 606. The first and second leads 604, 606 can be constructed of an electrically conductive, magnetic material such as NiFe and can thereby serve as magnetic shields as well as leads. First and second insulation layers 608, 610 are formed at the sides of the sensor stack 602 and extend over at least one of the leads 604, 606. In addition, first and second hard magnetic bias layers 612, 614 are preferably provided at either side of the sensor to provide magnetic biasing for the multilayer free layer.

The sensor stack 602 includes a multilayer magnetic free layer 616 and a magnetic pinned layer structure 618, and a spacer/barrier layer 620 sandwiched there between. If the sensor 600 is a tunnel valve (TMR) then, the layer 620 is a non-magnetic, electrically insulating barrier layer 620 sandwiched between the multilayer free and pinned layers 616, 618. On the other hand, if the sensor 600 is a CPP GMR sensor, then layer 620 is a non-magnetic, electrically conductive spacer layer.

The pinned layer structure may be one of many types of pinned layers, such as a self pinned, antiparallel (AP) coupled pinned layer, and AFM pinned structure, or a simple pinned structure having a single magnetic layer exchange coupled with a layer of antiferromagnetic material (AFM) layer. The pinned layer structure 618 may thus include first and second magnetic layers (AP1 and AP2) 622, 624 separated by and exchange coupled with a non-magnetic, electrically conductive antiparallel coupling layer (AP coupling layer) 626. The AP coupling layer 626 could be constructed of many materials, such as Ru, Cr. etc. The AP coupling layer 626 is configured to provide antiparallel coupling of the first and second magnetic layers 622, 624. The first magnetic layer AP1 is preferably exchange coupled with a layer of antiferromagnetic material (AFM) 628.

This exchange coupling with the AFM layer 628 strongly pins the magnetic moment 630 of the AP 1 layer 622 in a first direction perpendicular to the air bearing surface ABS. The strong antiparallel coupling of the AP1 and AP2 layers strongly sets the magnetic moment 632 of the AP2 layer 624 in a direction opposite that 630 of the AP1 layer 622. The multilayer free layer 616 has a magnetic moment 634 that is biased in a direction parallel to the ABS and perpendicular to the moments 630, 632 of the pinned layer 618. The biasing for the moment 624 of the multilayer free layer 616 is from magnetostatic coupling with the hard bias layers 612, 614.

The sensor stack 602 may also include a seed layer 636, disposed at the bottom of the sensor stack 602. The seed layer promotes a desired crystalline growth in the subsequently deposited layers, providing improved sensor performance. The sensor stack 602 may also include a capping layer 638, formed at the top of the sensor stack 602. The capping layer 638 serves to protect the other layers of the sensor stack 602 from damage during subsequent manufacturing processes such annealing.

Figure 7:
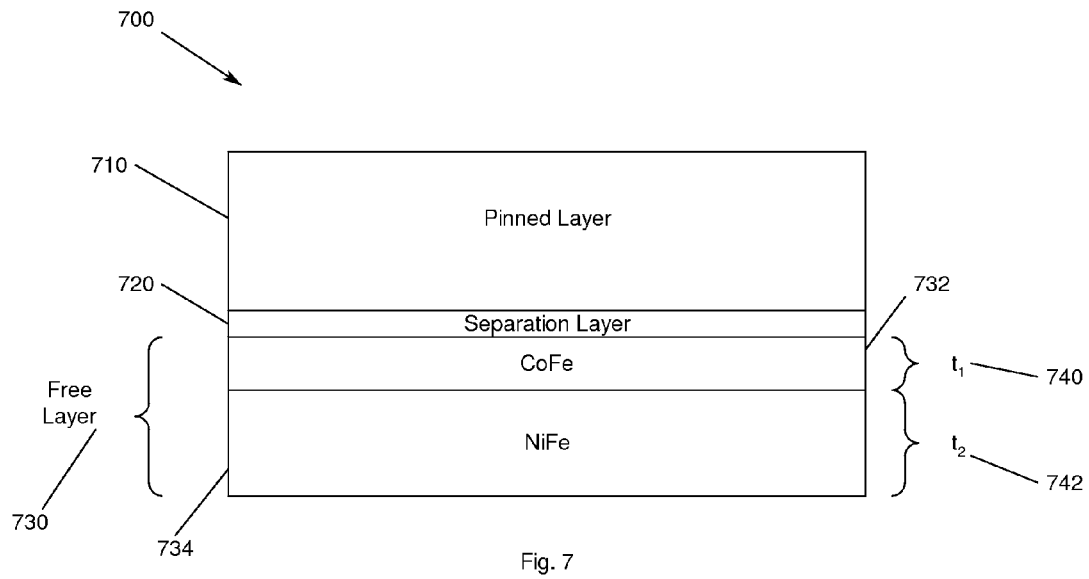
FIG. 7 illustrates a layered structure according to an embodiment of the present invention.

FIG. 7 illustrates a layered sensor structure 700 according to one embodiment of the present invention. In FIG. 7, a pinned layer 710, separation layer 720 and free layer 730 are shown. The free layer 730 is a synthetic bilayer structure that may include, for example a CoFe layer 732 and a NiFe layer 734. The composite magnetostriction of the free layer 730 needs to be tightly controlled for magnetic memory applications. This control has previously been accomplished by changing the composition of one of the layers 732, 734, e.g., the NiFe layer 734. However, according to an embodiment of the present invention, better magnetostriction control can be achieved by changing the thickness ratio between the layers 732, 734 in the free layer 730. FIG. 7 illustrates a free layer 730 wherein the relative thickness of the free layers 732, 734 is selected to provide a ratio between the thickness of the first free layer and the second free layer that provides a desired magnetostriction. Thus, the magnetostriction of the free layer 730 is controlled, not by changing the target compositions of the first and second layers 732, 734, but rather by modifying the relative thickness values of the free layers 732, 734 to obtain a desired magnetostriction. In FIG. 7, the first free layer 732 is designed to have a thickness of $t_1$ 740 and the second free layer 734 is designed to have a thickness $t_2$ 742. The ratio $t_1/t_2$ determines the magnetostriction. Those skilled in the art will recognize that the embodiments of the present invention are not meant to be limited to particular materials for the free layers 732, 734. Additional embodiments are described herein below.

Changing the relative thickness ratio of the free layers 732, 734 to control magnetostriction is easier and cheaper than changing the composition of, for example, the CoFe/NiFe free layer 730. Moreover, changing the relative thickness ratio between layers 732, 734 of the free layer 730 to control magnetostriction makes it possible to select any magnetostriction value within a range to meet the requirements for the free layer 730. In contrast, changing the composition of the free layers 732, 734 to control magnetostriction requires the use of many target compositions to obtain the same type of magnetostriction values.

Figure 8:
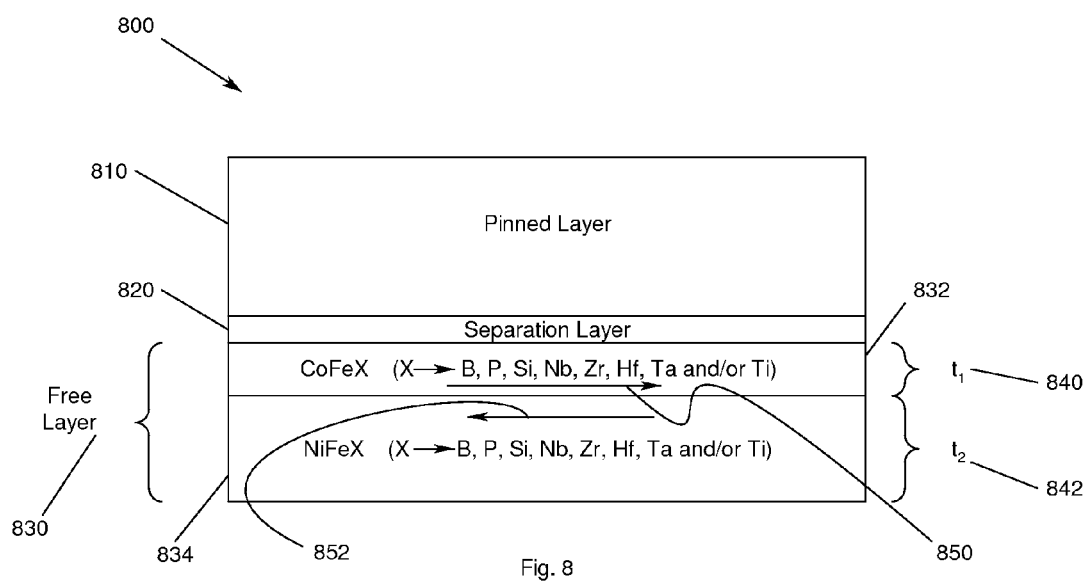
FIG. 8 illustrates a layered structure that uses different alloys according to an embodiment of the present invention.

FIG. 8 illustrates a layered sensor structure 800 that uses different alloys for the free layers according to another embodiment of the present invention. In FIG. 8, the sensor 800 includes a pinned layer 810, separation layer 820 and free layer 830. The free layer 830 is a bilayer structure. The synthetic bilayer structure 830 may be configured to provide a desired net magnetic moment 850, 852 because the moment of each layer of the synthetic free layer 830 are oriented in opposite directions, and each layer of the synthetic free layer 830 may be configured with different magnetization strengths. The bilayer structure 830 may include, for example, a CoFeX layer 832 and a NiFe layer 834. Alternatively, the free layer 830 may include, for example a CoFe layer 832 and a NiFeX layer 834.

Magnetostriction of the free layer in the spin-valve film is an important factor that determines the read performance of a spin-valve head. A magnetostriction of the free layer may an unstable read response because of un-desirable anisotropy that may be induced in the free layer In FIG. 8, the free layers (FL) 832, 834 are CoFe or NiFe alloys with amorphous states modified by a predetermined quantity of boron or other amorphous forming elements. For example, in one embodiment the CoFe alloy may be CoFeX, where X comprises at least one of B, P, Si, Nb, Zr, Hf, Ta and Ti. As described above, however, one of the free layers may be NiFeX, where X comprises at least one of B, P, Si, Nb, Zr, Hf, Ta and Ti. A multilayered free ferromagnetic stack may thus be formed by choosing the thickness and composition of the free layers so that the multilayered free layer has a desired net moment and a net magnetostriction that is near zero.

The plots herein below are provided to show characteristics of a CoFe/NiFe layer. However, plots for other composite materials, e.g., CoFex or NiFeX, are possible, but are omitted here for simplicity without attenuating the teaching of embodiments of the present invention.

Figure 9:
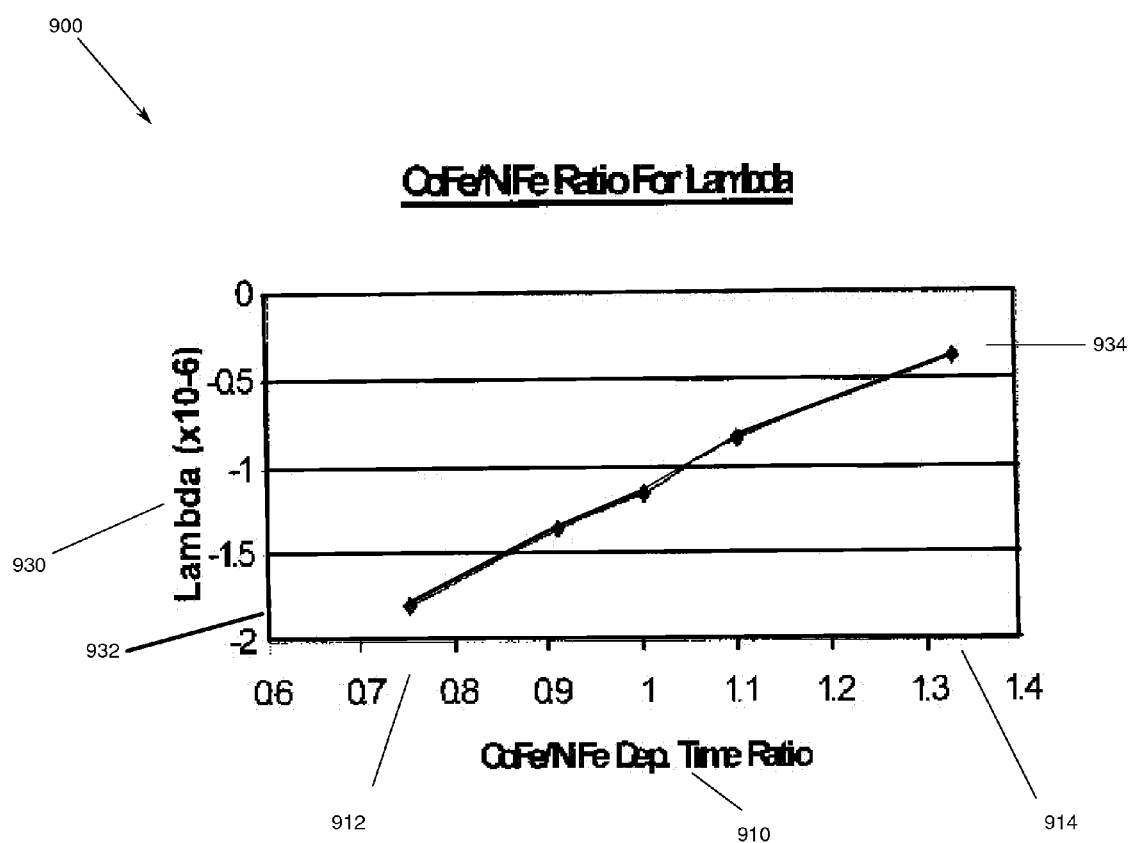
FIG. 9 illustrates a plot of the CoFe/NiFe ratio according to an embodiment of the present invention.

FIG. 9 illustrates a plot 900 of a ratio between CoFe/NiFe free layers according to an embodiment of the present invention. FIG. 9 shows that better control can be achieved by changing CoFe/NiFe ratio in the free layer. In FIG. 9, the CoFe/NiFe deposition time ratio 910 varies from about 0.75 912 to 1.35 914. The composite magnetostriction 930 varies from $-1.8 \times 10^{-6}$ 932 to $-0.4 \times 10^{-6}$ 934.

Figure 10:
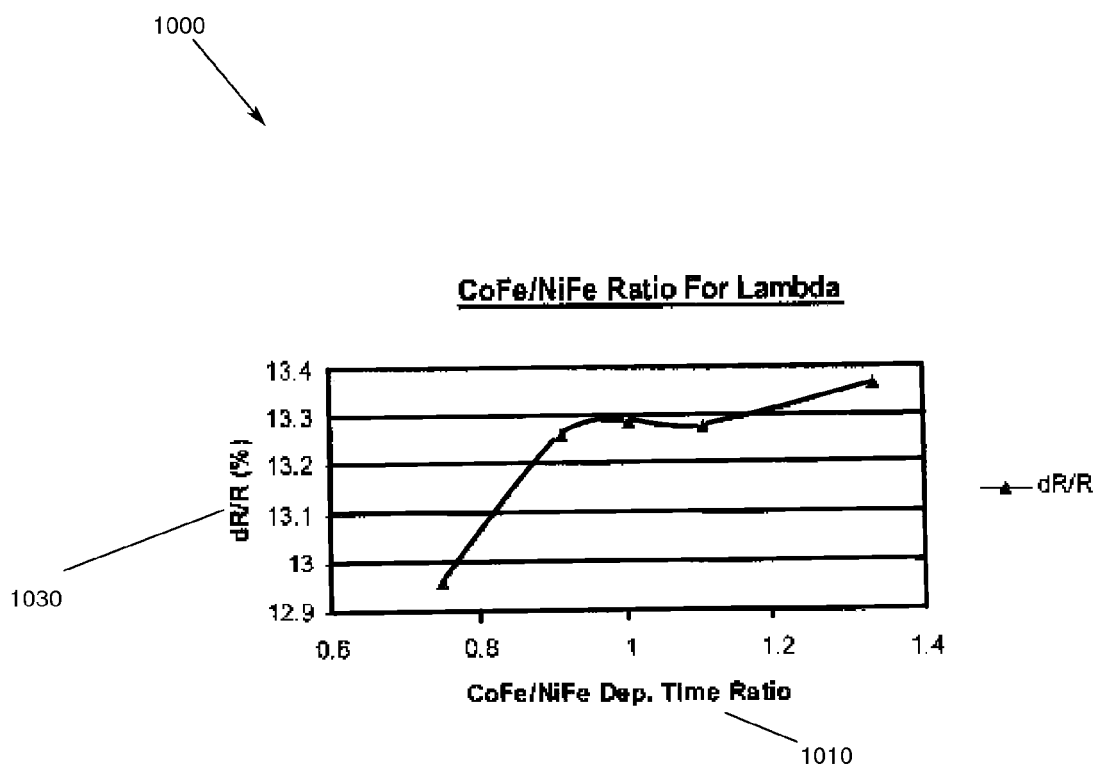
FIG. 10 is a plot of the dR/R for a range of CoFe/NiFe ratios for a sensor according to an embodiment of the present invention.

FIG. 10 is a plot 1000 of the dR/R for a range of CoFe/NiFe ratios for a sensor according to an embodiment of the present invention. In FIG. 10, the magnetoresistance ratio (MR ratio) 1030, dR/R, is the percentage change in resistance as an external magnetic field is switched between high and low values. FIG. 10 illustrates that the MR ratio 1030 is nearly constant with increasing CoFe/NiFe ratios 1010, i.e., 12.95% to 13.37%.

Figure 11:
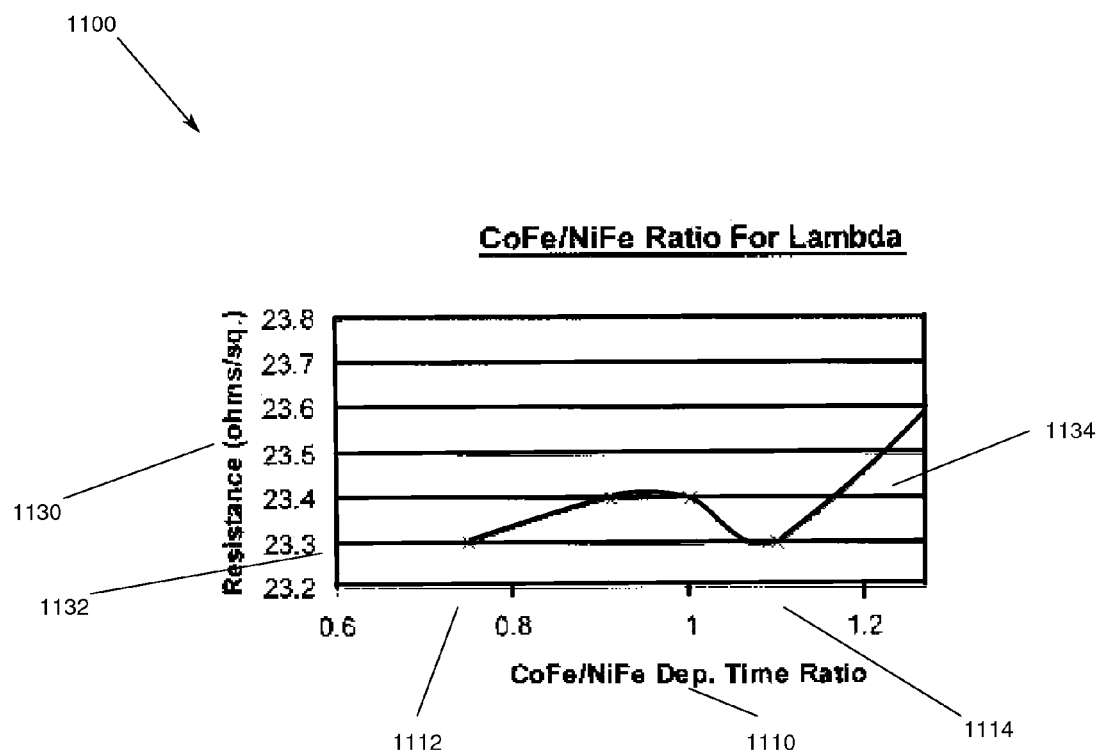
FIG. 11 is a plot of the sensor resistance for a range of CoFe/NiFe ratios according to an embodiment of the present invention.

FIG. 11 is a plot 1100 of the sensor resistance for a range of CoFe/NiFe ratios according to an embodiment of the present invention. In FIG. 11, the sensor resistance 1130 does not significantly change with increasing CoFe/NiFe ratios 1110. The sensor resistance 1130 varies from 23.3 ohms/sq. 1132 to 23.4 ohms/sq. 1034 for a CoFe/NiFe ratio 1110 range of about 0.75 1112 to 1.05 1114.

Figure 12:
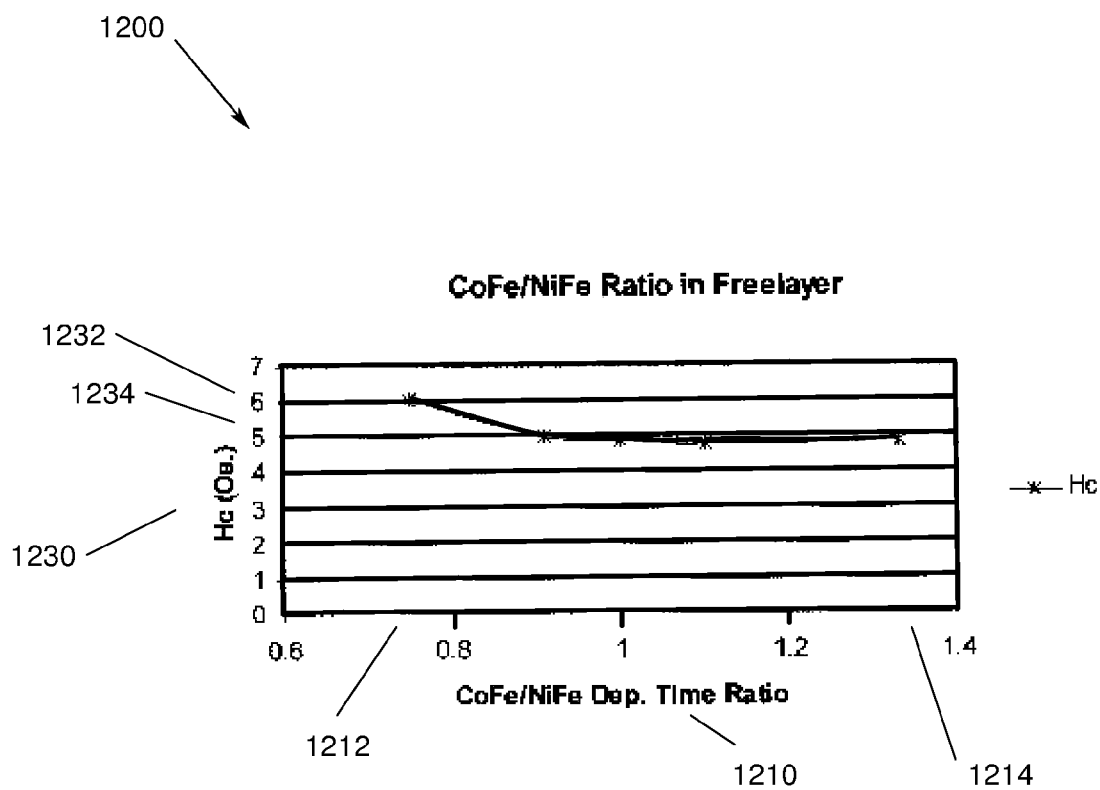
FIG. 12 is a plot of the coercivity of the free layer for a range of CoFe/NiFe ratios according to an embodiment of the present invention.

FIG. 12 is a plot 1200 of the coercivity of the free layer for a range of CoFe/NiFe ratios according to an embodiment of the present invention. In FIG. 12, the coercivity 1230 does not increase significantly with increasing CoFe/NiFe ratios 1210. The coercivity 1230 varies from about 6 Oe 1232 to about 4.8 Oe 1234 for a CoFe/NiFe ratio 1210 range of about 0.75 1212 to 1.35 1214.

Figure 13:
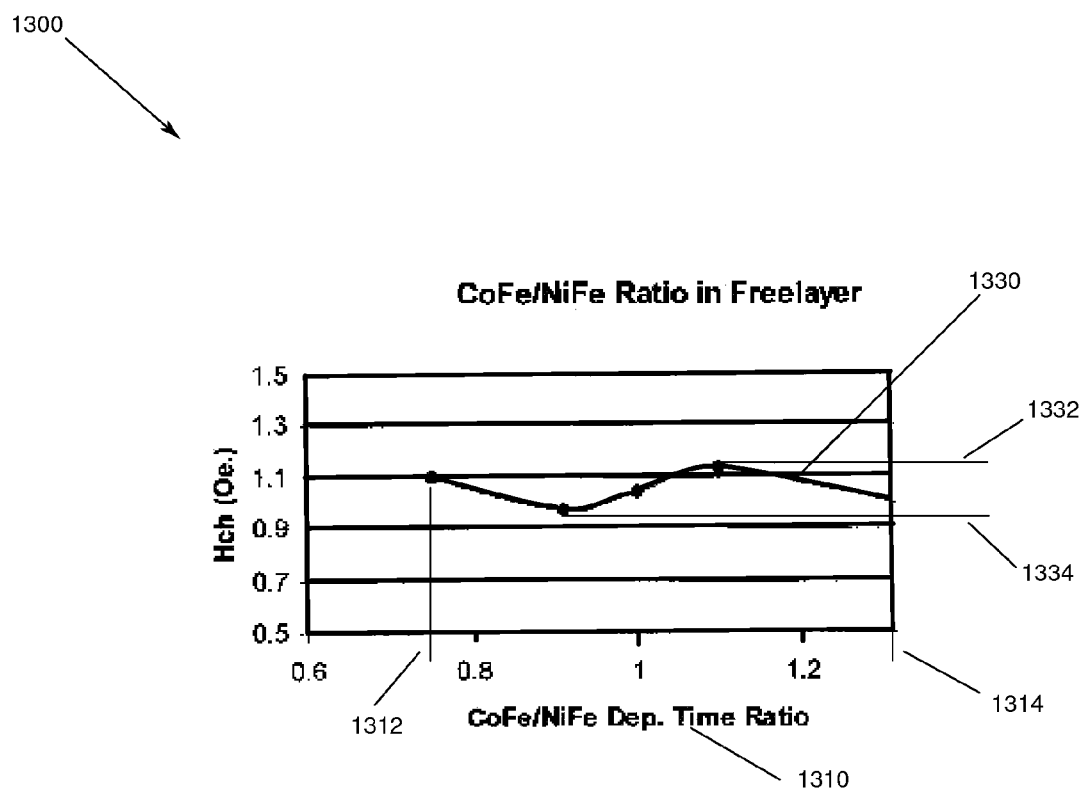
FIG. 13 is a plot of the hard axis coercivity of the free layer for a range of CoFe/NiFe ratios according to an embodiment of the present invention.

FIG. 13 is a plot 1300 of the hard axis coercivity of the free layer for a range of CoFe/NiFe ratios according to an embodiment of the present invention. In FIG. 13, the hard axis coercivity 1330 is relatively constant with increasing CoFe/NiFe ratios 1310. The hard axis coercivity varies from about 1.1 Oe 1332 to about 0.95 Oe 1334 for a CoFe/NiFe ratio 1310 range of about 0.75 1312 to 1.35 1314.

Figure 14:
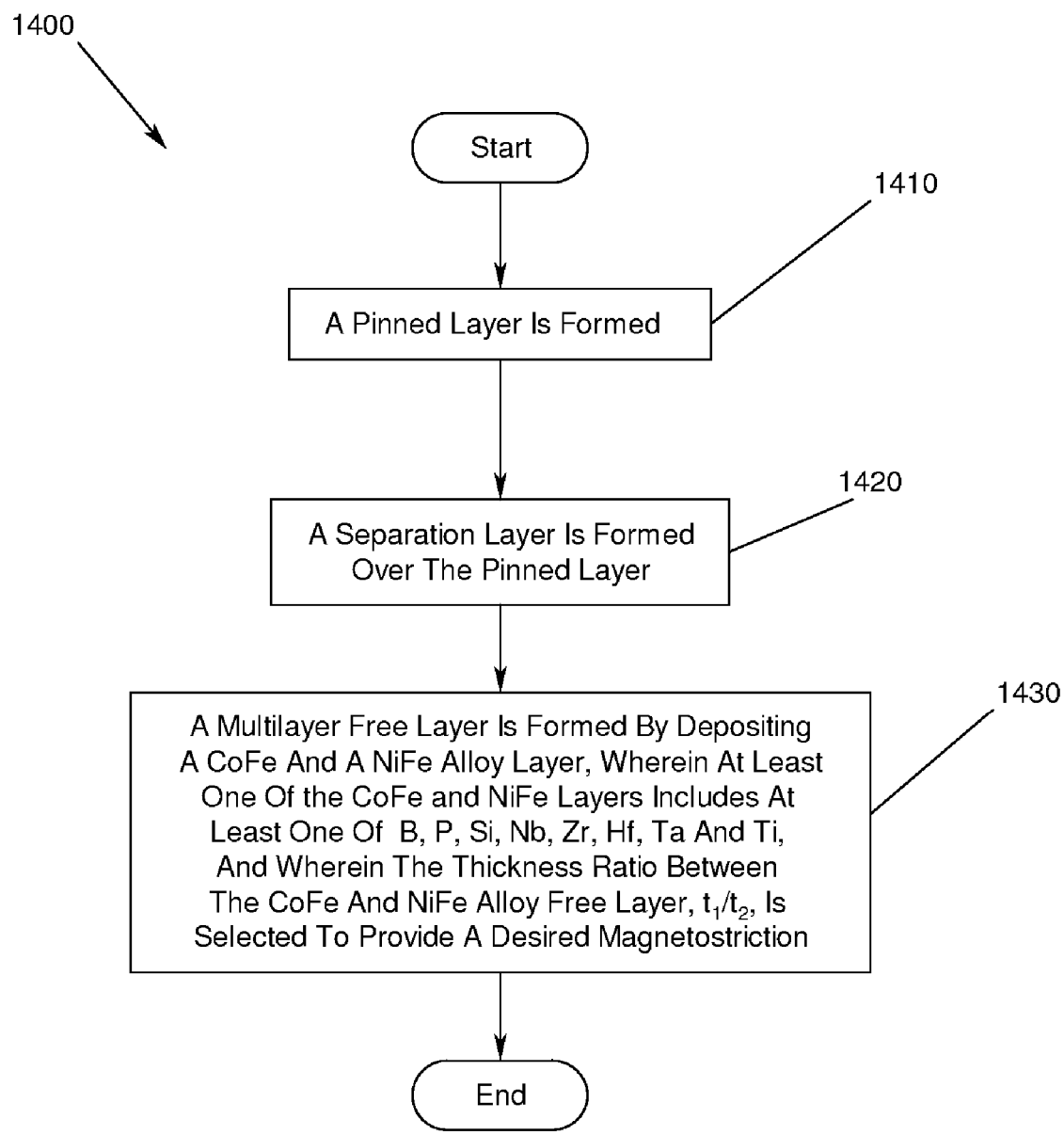
FIG. 14 is a flow chart for forming a magnetic memory device with a desired magnetostriction in a free layer of the magnetic memory device.

FIG. 14 is a flow chart 1400 for forming a magnetic memory device with a desired magnetostriction in a free layer of the magnetic memory device. In FIG. 14, a pinned layer is formed 1410. A separation layer is formed over the pinned layer 1420. A multilayer free layer is formed by depositing a CoFe and a NiFe alloy layer, wherein at least one of the CoFe and NiFe layers includes at least one of B, P, Si, Nb, Zr, Hf, Ta and Ti, and wherein the thickness ratio between the CoFe and NiFe alloy free layer, t1/t2, is selected to provide a desired magnetostriction 1430.

Accordingly, the embodiments of the present invention provide a method and apparatus for providing magnetostriction control in a free layer of a magnetic memory device. The same target compositions for the CoFe and NiFe layers are used, but the relative thickness values are modified to obtain a desired magnetostriction. Further, FIGS. 10-14 demonstrates that a change in the CoFe/NiFe ratio does not deteriorate the properties of structure according to an embodiment of the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for controlling magnetostriction in a free layer of a magnetic memory device, comprising:
    forming a pinned layer;
    forming a separation layer over the pinned layer; and
    forming a bilayer, composite free layer, the forming the bilayer, composite free layer includes:
        forming a first free layer, the first free layer comprising a CoFe alloy; and
        forming a second free layer, the second free layer comprising a NiFe alloy,
    wherein the forming the first free layer of CoFe alloy and the forming of the second free layer of NiFe alloy further comprises forming the first free layer of CoFe alloy with a predetermined first thickness and forming the second free layer of NiFe with a predetermined second thickness, wherein the ratio of the predetermined first thickness to the predetermined second thickness is selected to provide a predetermined magnetostriction and wherein at least one of the CoFe alloy and NiFe alloy includes an addition of at least one element of B, P, Si, Nb, Zr, Hf, Ta and Ti, the ratio of the first thickness and second thickness being selected to provide a desired magnetostriction and the addition of at least one element of B, P, Si, Nb, Zr, Hf, Ta and Ti being controlled to maintain a substantially constant sensor resistance while adjusting the ratio of the first thickness and second thickness to provide a desired magnetostriction.

2. The method of claim 1, wherein the first free layer comprises CoFeX, wherein X comprises at least one of B, P, Si, Nb, Zr, Hf, Ta and Ti and the second free layer is NiFe.

3. The method of claim 1, wherein the second free layer comprises NiFeX, wherein X comprises at least one of B, P, Si, Nb, Zr, Hf, Ta and Ti and the first free layer is CoFe.

4. The method of claim 1, wherein the separation layer is a layer selected from the group consisting of a conductor layer and an insulation layer.

5. The method of claim 1, wherein the first free layer and the second free layer are configured to provide a predetermined net magnetic moment.

6. A magnetic sensor, comprising:
    a pinned layer;
    a separation layer formed over the pinned layer;
    a bilayer, composite free layer, the forming the bilayer, composite free layer includes:
        a first free layer, the first free layer comprising a CoFe alloy; and
        a second free layer, the second free layer comprising a NiFe alloy,
    wherein the first free layer of CoFe alloy and the second free layer of NiFe alloy further comprises the first free layer of CoFe alloy formed with a predetermined first thickness and the second free layer of NiFe formed with a predetermined second thickness, wherein the ratio of the predetermined first thickness to the predetermined second thickness is selected to provide a predetermined magnetostriction and wherein at least one of the CoFe alloy and NiFe alloy includes an addition of at least one element of B, P, Si, Nb, Zr, Hf, Ta and Ti, the ratio of the first thickness and second thickness being selected to provide a desired magnetostriction and the addition of at least one element of B, P, Si, Nb, Zr, Hf, Ta and Ti being controlled to maintain a substantially constant sensor resistance while adjusting the ratio of the first thickness and second thickness to provide a desired magnetostriction.

7. The magnetic sensor of claim 6, wherein the first free layer comprises CoFeX, wherein X comprises at least one of B, P, Si, Nb, Zr, Hf, Ta and Ti and the second free layer is NiFe.

8. The magnetic sensor of claim 6, wherein the second free layer comprises NiFeX, wherein X comprises at least one of B, P, Si, Nb, Zr, Hf, Ta and Ti and the first free layer is CoFe.

9. The magnetic sensor of claim 6, wherein a first lead is disposed along an exposed surface of the pinned layer and a second lead is disposed along an exposed surface of the first or second free layer, wherein current flows from the first lead to the second lead perpendicular to a plane of the pinned layer, separation layer, first free layer and second free layer.

10. The magnetic sensor of claim 9, wherein the separation layer is a layer selected from the group consisting of a conductor layer and an insulation layer.

11. The magnetic sensor of claim 6, wherein the first free layer and the second free layer are configured to provide a predetermined net magnetic moment.

12. The magnetic sensor of claim 6, wherein a first lead is disposed at a first end of the first and second free layer and a second lead is disposed at a second end of the first and second free layer, wherein current flows from the first lead to the second lead in a plane of the first free layer and second free layer.

13. The magnetic sensor of claim 12, wherein the separation layer is a conductor layer.

14. The magnetic sensor of claim 12, wherein the separation layer is an insulation layer.

15. A magnetic storage system, comprising:
a movable magnetic recording medium;
a magnetic sensor for detecting magnetic signals on the moveable recording medium, comprising:
  a pinned layer;
  a separation layer formed over the pinned layer;
  a bilayer, composite free layer, the forming the bilayer, composite free layer includes:
    a first free layer, the first free layer comprising a CoFe alloy; and
    a second free layer, the second free layer comprising a NiFe alloy,
a magnetoresistance detector, coupled to the magnetic sensor, for detecting an electrical resistance through the magnetic sensor based on magnetic orientations of the first and the second free layers; and
an actuator, coupled to the magnetic sensor, for moving the sensor relative to the medium;
wherein the first free layer of CoFe alloy and the second free layer of NiFe alloy further comprises the first free layer of CoFe alloy formed with a predetermined first thickness and the second free layer of NiFe formed with a predetermined second thickness, wherein the ratio of the predetermined first thickness to the predetermined second thickness is selected to provide a predetermined magnetostriction and wherein at least one of the CoFe alloy and NiFe alloy includes an addition of at least one element of B, P, Si, Nb, Zr, Hf, Ta and Ti, the ratio of the first thickness and second thickness being selected to provide a desired magnetostriction and the addition of at least one element of B, P, Si, Nb, Zr, Hf, Ta and Ti being controlled to maintain a substantially constant sensor resistance while adjusting the ratio of the first thickness and second thickness to provide a desired magnetostriction.

16. The magnetic storage system of claim 15, wherein a first lead is disposed along an exposed surface of the pinned layer and a second lead is disposed along an exposed surface of the first or second free layer, wherein current flows from the first lead to the second lead perpendicular to a plane of the pinned layer, separation layer, first free layer and second free layer.

17. The magnetic storage system of claim 16, wherein the separation layer is a layer selected from the group consisting of a conductor layer and an insulation layer.

18. The magnetic storage system of claim 15, wherein the first free layer and the second free layer are configured to provide a predetermined net magnetic moment.

19. The magnetic storage system of claim 15, wherein a first lead is disposed at a first end of the first and second free layer and a second lead is disposed at a second end of the first and second free layer, wherein current flows from the first lead to the second lead in a plane of the first free layer and second free layer.

20. The magnetic storage system of claim 19, wherein the separation layer is a conductor layer.

21. The magnetic storage system of claim 20, wherein the separation layer is an insulation layer.

* * * * *